United States Patent [19]
Lee et al.

[11] Patent Number: 5,856,945
[45] Date of Patent: Jan. 5, 1999

[54] METHOD FOR PREVENTING SUB-THRESHOLD LEAKAGE IN FLASH MEMORY CELLS TO ACHIEVE ACCURATE READING, VERIFYING, AND FAST OVER-ERASED VT CORRECTION

[75] Inventors: Peter W. Lee, Saratoga, Calif.; Fu-Chang Hsu; Hsing-Ya Tsao, both of Taipei, Taiwan

[73] Assignee: Aplus Flash Technology, Inc., Saratoga, Calif.

[21] Appl. No.: 906,198

[22] Filed: Aug. 5, 1997

Related U.S. Application Data

[63] Continuation-in-part of Ser. No. 884,926, Jun. 30, 1997, Pat. No. 5,856,942, which is a continuation-in-part of Ser. No. 872,475, Jun. 5, 1997, Pat. No. 5,777,924, Ser. No. 819,323, Mar. 18, 1997, Pat. No. 5,848,000, which is a continuation-in-part of Ser. No. 624,322, Mar. 29, 1996, Pat. No. 5,646,890, Ser. No. 645,630, May 14, 1996, Pat. No. 5,687,121, Ser. No. 676,066, Jul. 5, 1996, Pat. No. 5,822,252, and Ser. No. 726,670, Oct. 7, 1996, Pat. No. 5,682,350.

[51] Int. Cl.$^6$ ............................. G11C 16/04; G11C 16/06
[52] U.S. Cl. ............................. 365/185.3; 365/185.18; 365/185.24; 365/185.33
[58] Field of Search ...................... 365/185.11, 185.12, 365/185.18, 185.22, 185.24, 185.29, 185.3, 185.33, 218

[56] References Cited

U.S. PATENT DOCUMENTS

| | | | |
|---|---|---|---|
| 5,455,792 | 10/1995 | Yi | 365/185.12 |
| 5,646,890 | 7/1997 | Lee et al. | 365/185.11 |
| 5,682,350 | 10/1997 | Lee et al. | 365/185.11 |
| 5,687,121 | 11/1997 | Lee et al. | 365/185.11 |
| 5,777,924 | 7/1998 | Lee et al. | 365/185.11 |

*Primary Examiner*—David Nelms
*Assistant Examiner*—Trong Phan
*Attorney, Agent, or Firm*—Pillsbury Madison & Sutro LLP

[57] ABSTRACT

The present invention provides a method for preventing sub-threshold leakage in flash EPROM cells during Vt repair, read and verify operations. The present invention prevents sub-threshold leakage by either biasing the floating gate voltage of non-selected cells to a level that is less than the sources voltage. This biasing is achieved by controlling the voltages applied to such non-selected cells bitline and wordline voltages, or by floating the non-selected sourcelines to electrically disconnect the sourcelines of the non-selected cells. This method allows fast and accurate Vt repair of cells while avoiding Vt degradation of non-erased and repaired cells due to subthreshold current leakage, as well as reduced sub-threshold leakage during read and verify operations.

26 Claims, 11 Drawing Sheets

METHOD FOR PREVENTING SUB-THRESHOLD LEAKAGE IN FLASH MEMORY CELLS TO ACHIEVE ACCURATE READING, VERIFYING, AND FAST OVER-ERASED VT CORRECTION

REFERENCE TO RELATED APPLICATIONS

This is a continuation-in-part of U.S. Ser. No 08/884,926 entitled "Novel Flash Memory Array and Decoding Architecture", filed Jun. 30, 1997, now U.S. Pat. No. 5,856,942, which is a continuation-in-part of U.S. Ser. No. 08/872,475 filed Jun. 5, 1997 now U.S. Pat. No. 5,777,924, 08/819,323 filed Mar. 18, 1997, now U.S. Pat. No. 5,848,800, which is a continuation-in-part of U.S. Ser. No. 08/624,322 filed Mar. 29, 1996 U.S. Pat. No. 5,646,890, filed May 14, 1996 now U.S. Pat. No. 5,687,121, U.S. Ser. No. 08/676,066 filed Jul. 5, 1996 now U.S. Pat. No. 5,822,257, and U.S. Ser. No. 08/726,670 entitled "Flash memory with divided bitline" filed Oct. 7, 1996, now U.S. Pat. No. 5,682,350 which are incorporated herein by reference.

BACKGROUND OF THE INVENTION

1. Field of the Invention

The present invention relates to flash EPROM's and a method for preventing sub-threshold leakage in flash EPROM cells, and more particularly, a method for preventing sub-threshold leakage in flash memory cells during overerase Vt repair operations, read operations and verify operations.

2. Description of the Related Art

Programming operations in an EPROM-type flash memory require injecting electrons into a floating gate to increase the cell's threshold voltage Vt through a channel-hot-electron (CHE) process, while erase operations involve removing electrons from the floating gate of the EPROM to lower the cell's threshold voltage Vt through Fowler-Nordheim tunneling.

During the erase operation, however, overerasing can occur if too many electrons are removed, lowering the cell's Vt below ground to a negative value and causing the cell to be in a permanently "on" condition. When conventional erase techniques are used, such a cell cannot be shut off, causing undesired current leakage in the bitline, which can result, thereafter, in false memory readings due to cells existing that have been improperly erased.

A commonly used operating voltage Vdd in flash memories is 5V, and for this Vdd, a Vt between 0.5V and 3V is often considered a data "1" and a Vt greater than 6V is often considered a data "0." FIG. 1 illustrates a typical distribution of cells after an erase operation of certain cells in a bitline in a left column, with the change in the distribution of the cells' Vt versus time in a given bitline during a conventional Vt repair operation in the right column.

After an erase operation, to correct an overerased cell, the cell's negative Vt must be programmed back to the positive level, usually to around 1V, in a negative Vt correction process, also known as Vt repair. FIG. 1 is provided to assist in understanding the Vt voltages of the cells through the Vt repair process. Regions A, B, C and D have been identified for purposes of defining different Vt characteristics. Thus, Region B corresponds to a region in which cells having a Vt within this region may experience undesired hot-hole injection. Region C corresponds to a region in which cells having a Vt within this region may experience channel-hot-electron injection and represent the Vt range of over-erased cells needing Vt repair; that is, cells having a negative Vt. The Vt for region C cells can fall as low as −3V. Cells within Regions A and D will experience no such injection, but differ in that Region D corresponds to a data "0" program state, whereas region A primarily corresponds to an uncertain state between a data "1" and a data "0", although as illustrated in FIG. 1, a lower portion of the band within Region A may correspond to a data "1." The uncertain state of Region A can also be viewed as a region corresponding to cells with a Vt that was improperly erased and verified. The voltage gap, uncertain region within Region A is purposefully included to separate the data "1" and data "0" states so cells having different data can easily be differentiated. It should also be noted that the particular voltage separating regions A and B corresponds to the UV erase voltage Vt*, which, for the FIG. 1 known embodiment, corresponds to 2V.

One proposed method for avoiding over-erased cells is to pre-program selected cells at a higher Vt before the erasing operation is carried out, erase the cells, and then perform the Vt repair operation on any cells that have been overerased. Preprogramming the cell's Vt to a higher positive level, such as greater than 6V for the embodiment of FIG. 1 referenced above, before carrying out the erase operation reduces the chances (and usually the number) of overerased cells, but because the pre-programmed Vt and other cell characteristics can vary between cells, there is still an unpredictable number of overerased cells (that is, cells having a negative Vt) after the erase operation despite the cautionary pre-programming step. Thus, the negative Vt of these over-erased cells still have to be programmed back to a positive Vt, such as about 1V for the FIG. 1 embodiment being described, in a Vt repair operation, notwithstanding the additional pre-programming step before erasure. Further, in the case of block erasure, many cells in different wordlines are erased together as an entire block without differentiating between cells requiring erasing and those that do not in a particular group. As a result, cells not requiring any erasing or repair may suffer Vt repair disturbance, causing unnecessary Vt voltage drops in cells that were originally acceptable before the Vt repair operation. If the initial Vt of a particular cell was positive, but still lower than the UV erase voltage Vt*, the Vt repair disturbance may cause the Vt of that cell to become negative and consequently require later Vt repair even though the cell was acceptable before the Vt repair operation began. Clearly, these extra Vt repair operations increase processing time.

Another proposed method for remedying the over-erasure problem is described in U.S. Pat. No. 5,521,867 to Chen et al. Chen describes a circuit that attempts to converge the erase threshold voltage distribution in the memory cells to a selected steady-state threshold voltage that is higher than the self-convergence steady state threshold voltage, which is the Vt. The '867 reference teaches coupling a first voltage source to the bitlines in the memory and coupling a second voltage source to the wordlines to converge the threshold voltages of erased memory cells to the same steady-state threshold voltage. The steady-state threshold voltage Vth* is selected to minimize the number of cells receiving hot hole injection; in FIG. 8 of the Chen patent, 1V is selected. This method, however, still does not address the problem of protecting cells from Vt repair disturbance or degradation; in fact, it appears that the '867 patent accepts some oxide and Vt degradation through hole injection as a necessary part of the convergence process, as shown in FIG. 8 (col. 10, lines 40–57 in Chen).

Referring now to FIGS. 1 and 2, the prior art method applies 0V to all wordlines and +5V to the selected bitline, regardless of whether the cells in the bitline need Vt repairing or not. As a result, cells 100 and 108, which have Vt's in regions A and D respectively, are shut off. Cell 102, in region B, experiences oxide and Vt degradation as hot hole injection lowers the cell's 102 Vt toward 0V. For overerased cells 104 in region C, which have negative Vt's, avalanche hot electron injection is used to repair the cells' Vt, but the Vt repair process tends to be very slow. Although this prior art method attempts to converge the Vt's of all the cells to a fixed, final voltage of 0V, FIG. 1 shows that after the Vt repair operation, the Vt's of the cells can still range from −1V to +1V, depending on each cell's characteristics. These variations can cause undesirable false readings in the flash memory. Further, cells may even have a Vt between 3V and 6V, thus falling into region A due to an improper erase operation. As noted above, these region A cells are unacceptable because they are neither data "1" nor data "0" cells. In short, prior art erase and Vt repair operations cannot accurately place each individual cell's Vt into an acceptable condition because all operations are done collectively on multiple cells. Further, fluctuations in the cells' Vt due to hot-hole injection and subthreshold current leakage make it difficult to evaluate and correct the Vt of each individual cell.

Prior art methods for Vt repair present numerous other problems as well. At most, only two wordline voltages are applied simultaneously during Vt repair, one to non-selected wordlines and one to selected wordlines and, as noted above, a single wordline voltage is applied to all selected erased wordlines during Vt repair. No attempt is made to generate a wordline voltage for shutting off sub-threshold leakage in non-selected wordlines cells with large negative Vt's. In addition, the Vt repair operation in many prior art methods is collectively performed on all cells in a selected bitline, regardless of whether the cells actually need Vt repair. Known methods also fail to address how the resultant Vt drop caused by subthreshold current leakage and Vt repair process disturbance in other cells can be prevented. Further, in prior art methods, the wordline voltage for the cells selected for Vt repairing usually ranges between −1V and +1V, which is not low enough to shut off the over-erased cells with Vts less than −1V and yet not high enough to return them quickly to a controllable, precise, positive Vt required for normal read operations. Convergence processes pose additional problems because the erase speed can be extremely slow, even slower than 100 ms, and the correlation between the measurement and real bitline convergence is un-matched. Also, the wordline voltage needed to increase the convergence of Vt*, in practice, tends to vary as the cell characteristics vary, making it difficult to converge Vt* as a practical matter.

There is a need for an EPROM-type flash memory that not only Vt repairs overerased cells, but also protects other cells from Vt disturbance or degradation caused by the Vt repair process. There is also a need for an erasing and Vt repair process for low Vdd operations that has high speed, low current consumption, and achieves longer endurance cycles than conventional Vt repair processes for EPROM-type flash memories.

Subthreshold leakage can also occur during a read or verify operation, particularly when the selected bitline voltage is high and the number of non-selected but low Vt cells are too great. The higher bitline voltage and greater number of non-selected by low Vt cells in the bitline will increase the sub-threshold leakage and result in false readings.

SUMMARY OF THE INVENTION

It is therefore an object of the invention to provide a method for preventing sub-threshold leakage in flash EPROM cells.

It is another object of the invention to provide a method for preventing sub-threshold leakage in flash EPROM cells during Vt repair, read and verify operations.

It is another object of the invention to provide a method for Vt repairing overerased cells in an EPROM-type flash memory in a fast, bit-by-bit operation one wordline at a time.

It is also an object of the invention to provide a method for Vt repairing a flash memory that allows precise programming, erasure, Vt repair and verification of each cell quickly and accurately.

In order to achieve the above objects of the invention, among others, Vt repair according to the present invention avoids the problems associated with collective repair, Vt and oxide degradation of cells through hole injection, and Vt disturbance of other properly erased or repaired cells.

The present invention prevents sub-threshold leakage by either biasing the floating gate voltage of non-selected cells to a level that is less than the sources voltage. This biasing is achieved by controlling the voltages applied to such non-selected cells bitline and wordline voltages, or by floating the non-selected sourcelines to electrically disconnect the sourcelines of the non-selected cells.

In the embodiment that biases the floating gate electrode by controlling the bitline and wordline voltages, the invention applies one of three different wordline voltage types to the gates of each cell, regardless of whether they are erased properly or improperly, during the Vt repair operation to differentiate between cells having different Vt characteristics and repair or maintain them accordingly. A first wordline voltage type increases a negative Vt in an overerased cell selected for repair to a positive Vt by making Vg (the floating gate voltage) higher than Vg* (the gate voltage at which hole injection and electron injection are in balance), thereby correcting the Vt of the overerased cell. A second wordline voltage type, which is selected to be lower than the lowest threshold voltage of the non-selected over-erased cells, is used to hold the wordline voltage of such cells below ground to shut off these cells completely and prevent their Vt characteristics from changing as an erased cell in the same bitline is being repaired. A third wordline voltage type, in conjunction with a selected sourceline voltage type, is applied to cells that have not been overerased, cells that have already been repaired from overerasure; or cells that were not erased.

Unlike conventional methods, the selected source and wordline voltages bias the floating gate voltage to be less than the source voltage. This prevents the channel from conducting sub-threshold current and generating hot holes or hot electrons, which may inadvertently lower the cell's Vt to below ground level. Thus, providing three different wordline voltage types specifically tailors the applied wordline voltage to the specific Vt characteristics of each cell. Two different sourceline voltage types can also be used in conjunction with the wordline voltages described above to enhance the invention's performance further. As the Vt of the cells change, the voltage applied to their gates and sources can be changed to adapt to the cells' new characteristics.

In one particular embodiment of the present invention that biases the floating gate electrode by controlling the bitline and wordline voltages during Vt repair, the desired Vt characteristic by maintaining by applying a −1V wordline voltage and grounding the source or by grounding the wordline and applying a +1V source voltage.

In the embodiment of the present invention that biases the floating gate electrode by floating the non-selected sourcelines to electrically disconnect the sourcelines of the non-selected cells and by applying a +1V or 0V wordline voltage, the Vt repair operation can differentiate between cells having different Vt characteristics and repair or maintain them accordingly. Keeping the floating gate voltage less than the source node voltage for each cell biases the cell in a completely "off" state, preventing any subthreshold current from leaking during Vt repair of another cell in the bitline and thereby preventing Vt degradation of the cell.

Further, the invention prevents the on-chip current pump from overloading during Vt repair because each bitline only has one cell being repaired while all of the other cells are shut off. By using the three wordline voltage types with one source voltage or three wordline voltage types with two sourceline voltages, cells are either programmed by high speed CHE injection or shut off completely; no time is wasted through slow avalanche-hot-electron injection, nor does oxide or Vt degradation caused by hot-hole injection occur.

Still furthermore, the present invention can also eliminate subthreshold leakage during a read or verify operation. This is achieved, in one embodiment, by applying a 0V ground voltage to the wordlines of unselected cells, and a positive voltage, such as 1V or floating, to the sources of unselected cells. Such biasing of unselected cells eliminates the subthreshold leakage in unselected cells on a bitline during a read or verify operation.

BRIEF DESCRIPTION OF THE FIGURES

These and other objects, features and advantages of the present invention are better understood by reading the following detailed description of the preferred embodiment, taken in conjunction with the accompanying drawings, in which.

DETAILED DESCRIPTION OF THE PREFERRED EMBODIMENTS

Figure 1:
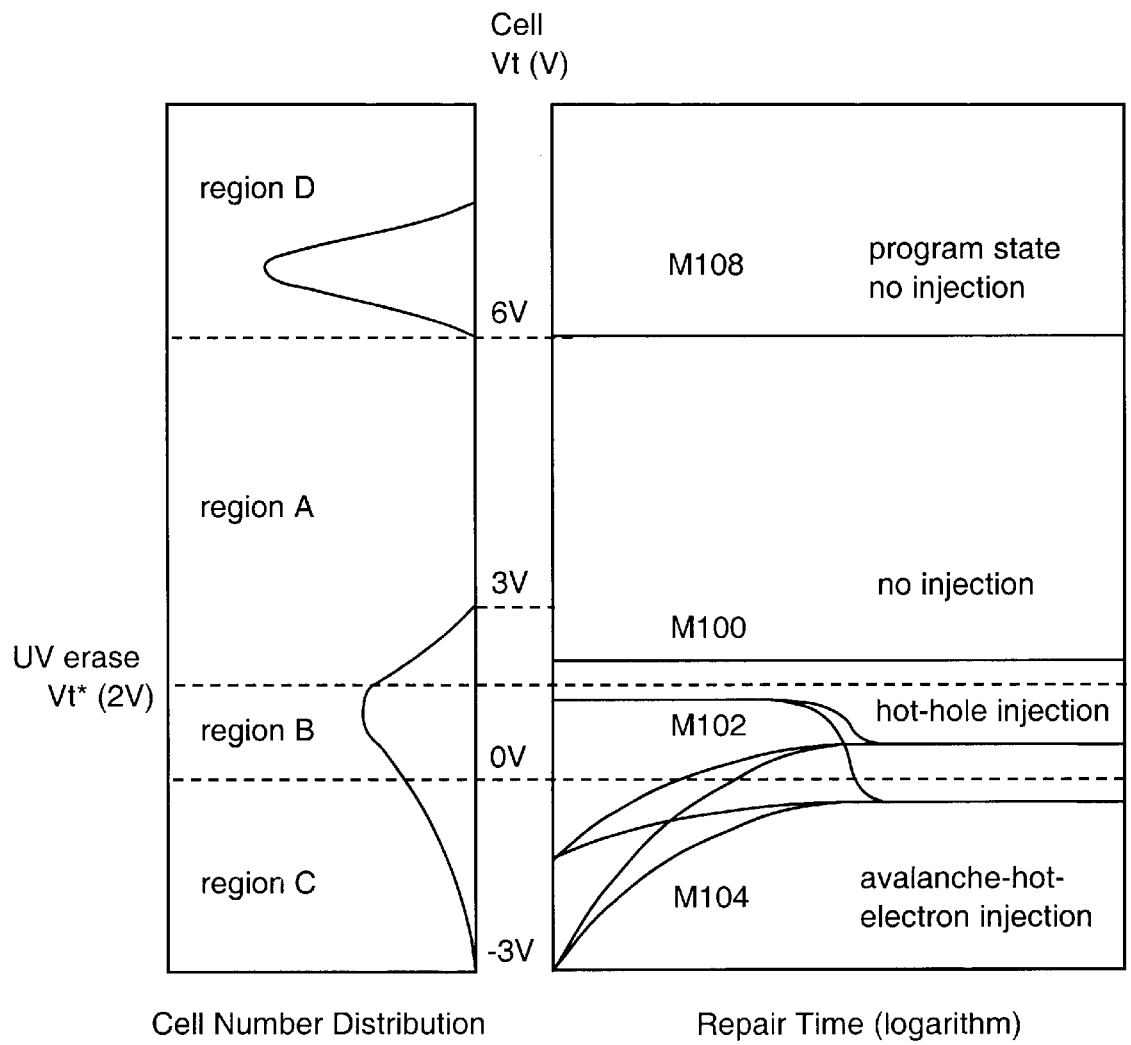
FIG. 1 is a graph illustrating the Vt distribution of cells versus time in a given bitline during a prior art Vt repair operation.
Figure 2:
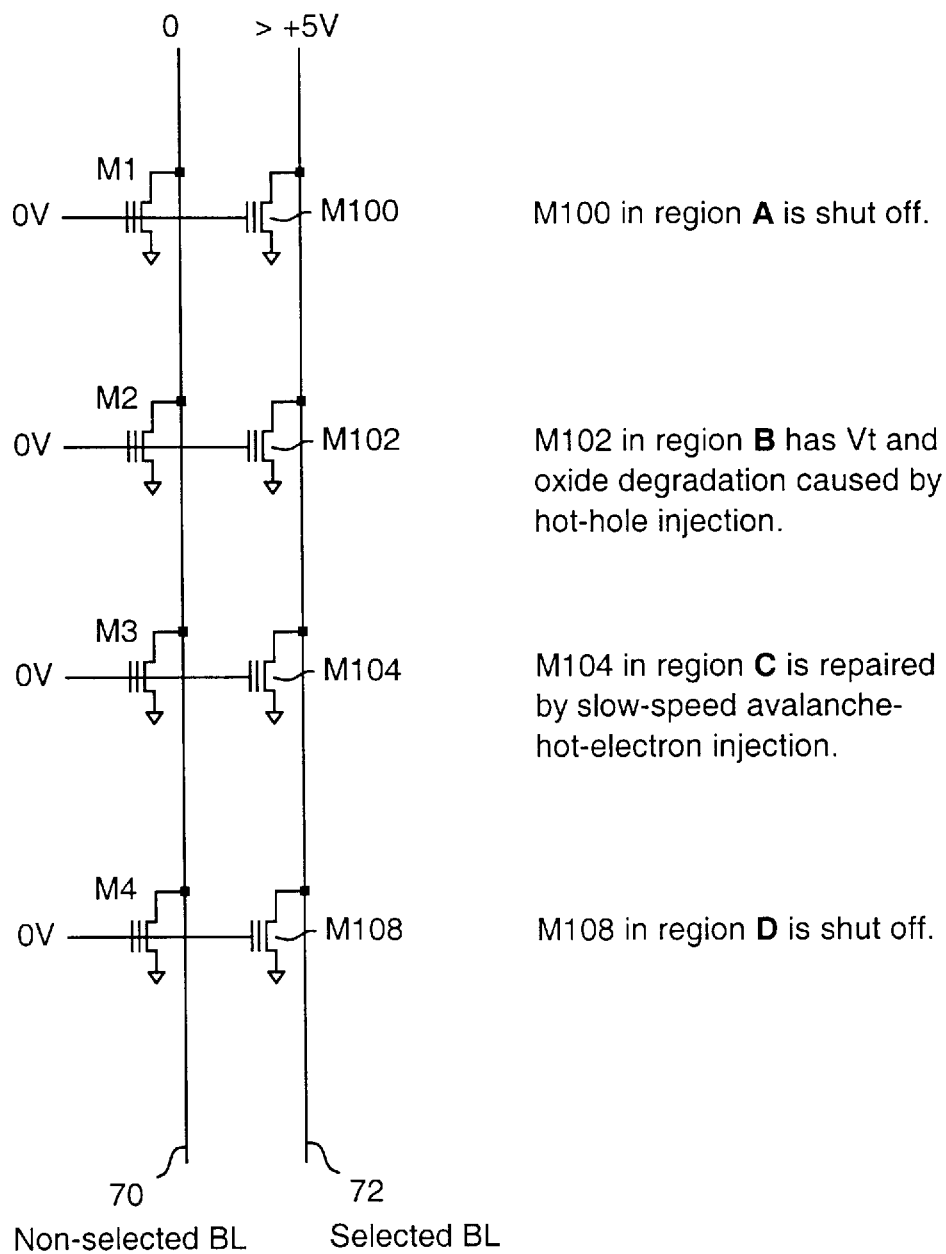
FIG. 2 is a circuit diagram corresponding to the graph of FIG. 1.
Figure 3:
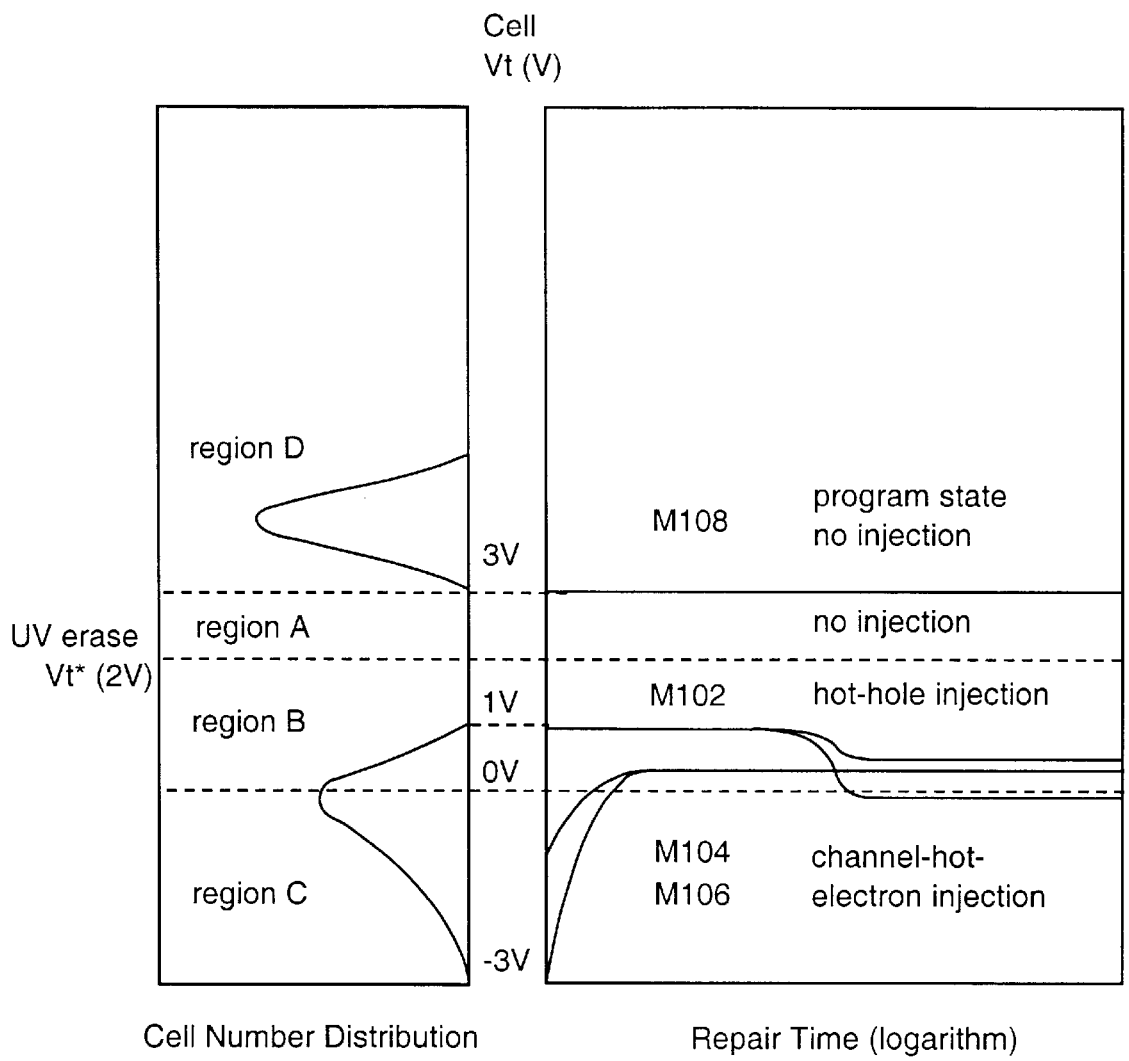
FIG. 3 is a graph illustrating the Vt distribution of cells versus time in a given bitline during another prior art Vt repair operation.
Figure 4:
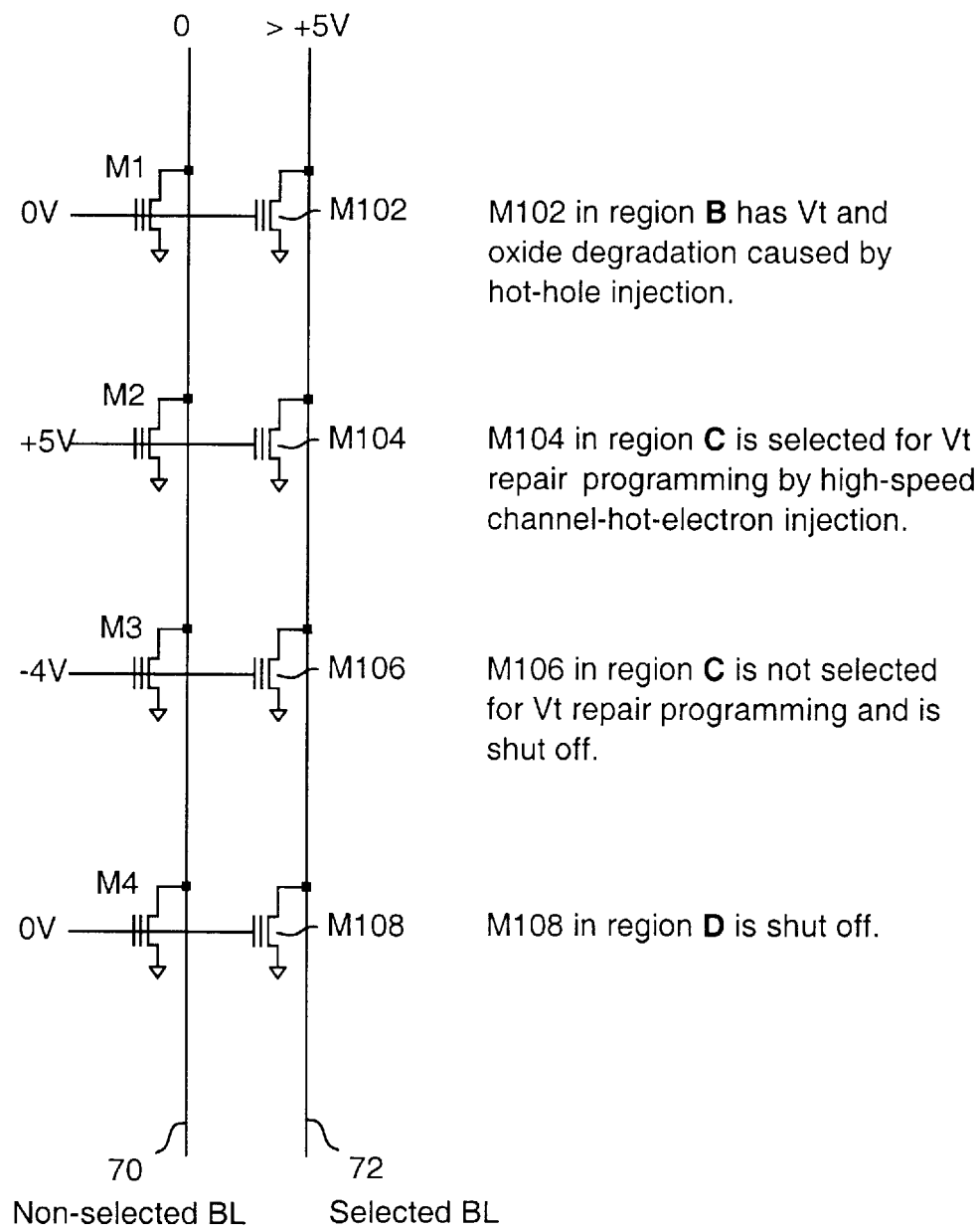
FIG. 4 is a circuit diagram corresponding to the graph of FIG. 3.

FIGS. 3 and 4 illustrate the Vt characteristics of cells that are repaired as described in applicants' pending application, U.S. application Ser. No. 08/823,571 filed on Mar. 25, 1997 and entitled "Novel Approaches to Fully Eliminating Over-Erasure Induced Problems and Enhancing Write Operation, which is incorporated by reference herein. As described in that application, Vt repair speed and accuracy is increased by applying +5V to a selected erased cells 104 to program such cells by high speed channel-hot-electron injection. Non-selected erased cells 106 are shut off using a third type of wordline voltage, which is a wordline voltage that is greater than the maximum negative erased Vt. For example, −4V is applied to a cell having a negative Vt of −3V. With this method, all cells that were overerased and existing with Region A will be repaired such that they then become Region B cells having a positive Vt.

However, using this method, cells in Region B, which after the erase operation have an acceptable positive Vt that is less than Vt*, may have this acceptable Vt undesireably lowered to a lower positive or even to a negative Vt, as illustrated in FIG. 3, during a Vt repair operation being performed on a different cell. There is also the problem of oxide degradation in Region B cells, such as cell 102 illustrated in FIG. 4. These problems are caused by subthreshold current leakage. As a result, cells in Region B having an acceptable initial Vt may later require Vt repair if the fluctuations cause their Vt to become negative.

As also shown in FIG. 3, when a lower Vdd is used in the manner as shown with respect to the FIG. 4 embodiment, the threshold ranges for data "1" and data "0" must be narrowed to fit within the reduced voltage range. Typical threshold ranges for a 1.8V Vdd operating voltage, for example, are a Vt between 0.5V and 1V for a data "1" (region B) and a Vt greater than 3V for a data "0" (region D), as shown in FIG. 3. Even with this reduced voltage range, however, overerasing is a problem, since overerasing will induce bitline leakage current and thus result in a false reading in a subsequent read operation.

Figure 6:
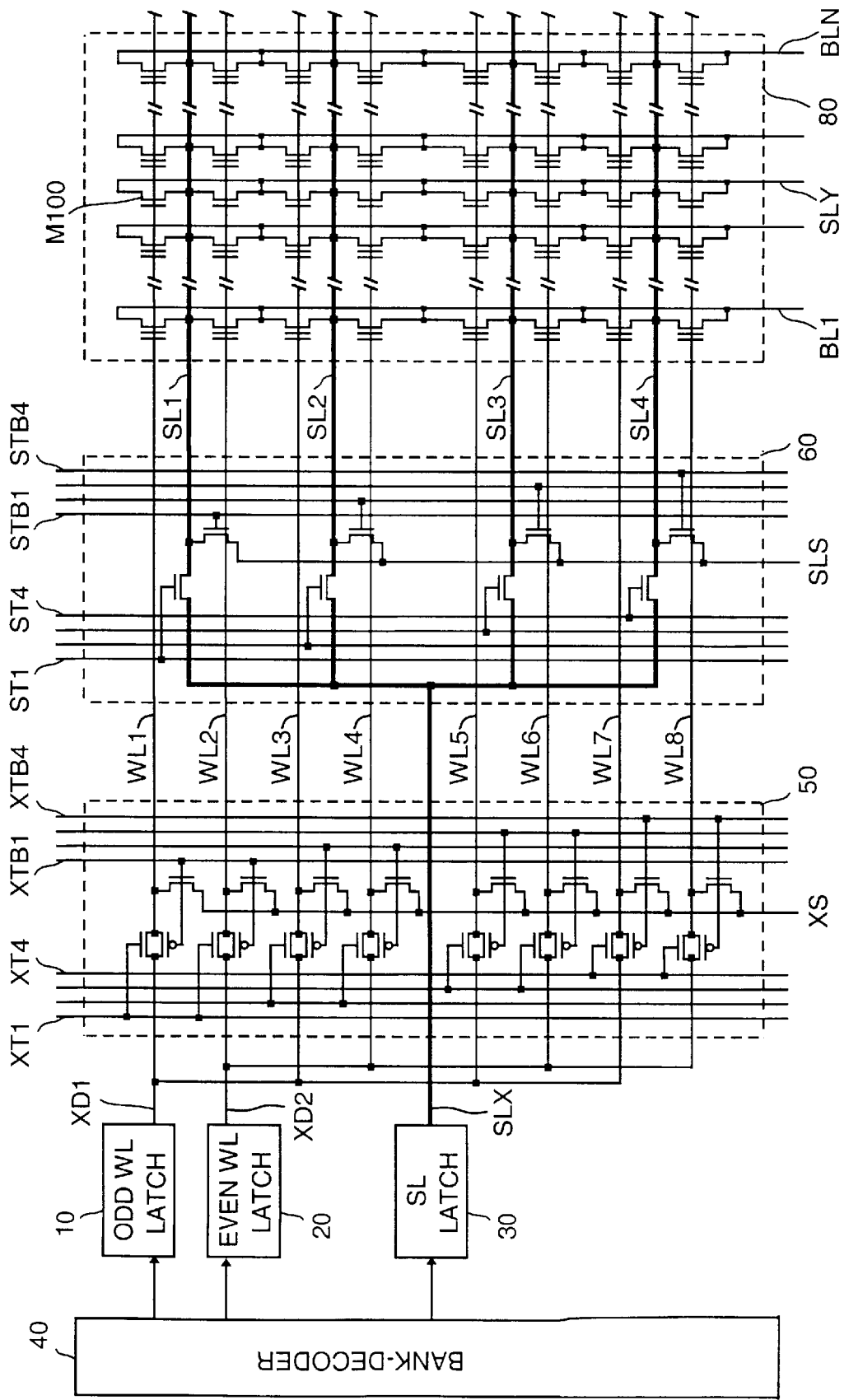
FIG. 6 is a diagram of a circuit employing the method of the invention.

Accordingly, an improved method of repairing overerased cells is described herein. This method, as described more fully hereinafter, preferably uses a multi-latch circuit such as that described in co-pending application U.S. Ser. No 08/884,926 entitled "Novel Flash Memory Array and Decoding Architecture", filed Jun. 30, 1997, which is incorporated herein by reference. A block diagram of such a circuit is shown in FIG. 6. As described in that application, different voltages can be simultaneously applied to different selected and non-selected wordlines. Preferably, one of an odd and even wordline latch is provided for each wordline and a source latch is provided for the source lines in each block. This allows for Vt repair to be performed one wordline at a time instead of one entire block at a time to preserve a high degree of flexibility in erasing and programming each cell. The circuit can also generate three different wordline voltages and two different sourceline voltages if needed. Multiple bitlines can be selected for Vt repair depending on the capacity of the current pump, but preferably only one cell per bitline is Vt repaired during each Vt repair cycle.

The method contemplated by the invention does not prevent overerasures from occurring; instead, it aims to repair overerased cells by a method at a higher speed, having more accurate Vt control and lower current usage than known Vt repair methods. Note that the pre-programming step is avoided, reducing overall power consumption and waste. Further, for cells that are not overerased and have an acceptable Vt, the present invention provides a manner of isolating such cells to maintain their Vt characteristics when other overerased cells in the same bitline are being repaired.

Figure 5:
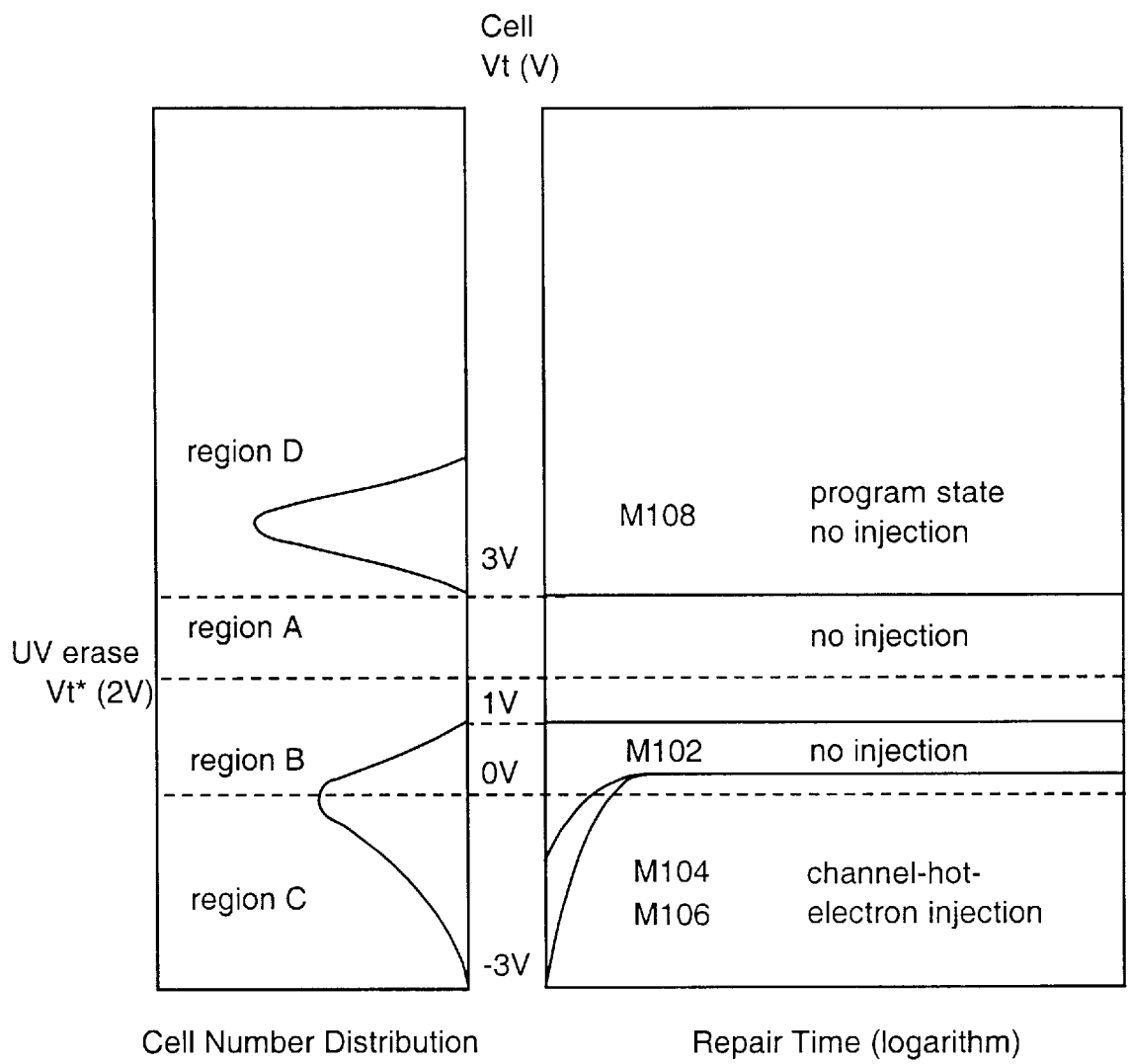
FIG. 5 is a graph illustrating the Vt distribution of cells versus time in a given bitline during a Vt repair operation according to the present invention.

FIG. 5 shows a classification of each cell by the cells Vt characteristic so that each cell can be classified into one of Regions A, B, C, or D, as described previously. Thus, FIG.

5 illustrates a distribution of cells after erasure in the flash memory according to their threshold voltage Vt. Cells having a Vt in region C have negative Vt's, being overerased, can be selected for Vt repair during a particular Vt repair cycle or not selected for repair during a particular repair cycle. Cells having a Vt in regions B and D are both cells having desirable Vt characteristics that should be preserved during the Vt repair process. Region B cells are either properly erased or Vt repaired cells, while Region D cells are cells which are not erased. According to the present invention, no cells will fall into Region A since the invention prevents cells from being incorrectly erased and verified.

Because cells in regions B and D are not selected for repair during a particular Vt repair cycle, these cells are shut off during the Vt repair operation to prevent bitline leakage and protect their Vt characteristics as another cell in the bitline is being Vt repaired. Overerased but non-selected region C cells are also shut off.

It should be noted that region B cells, which have a positive value that is less than Vt* are the cells which may suffer from subthreshold current leakage. Accordingly, as has been described, these region B cells are subjected to a negative wordline voltage for the reasons previously provided. Since region D cells have a higher Vt, they will have a negative charge build up in their floating gate. Thus, such region D cells could have a ground voltage applied as both the wordline voltage and the sourceline voltage. The present invention, however, still applies a -1V wordline voltage to these cells so that a fourth wordline voltage is not necessary. Such a wordline voltage level on region D cells could, however, be used and would be within the intended scope of the invention.

A more specific example of the various cell categories and their treatment during the Vt repair operation is explained with reference to FIGS. 7 through 9, which each show a plurality of cells in a single erased bitline selected for repair and their respectively applied wordline and sourceline voltages according to the invention. Each of these illustrated cells represent cells that exist in each of the different Vt characteristic regions A–D. Regardless of the specific voltage values chosen for the wordline voltage and the source voltage, the voltages chosen prevent subthreshold current leakage by biasing the floating gate voltage of non-erased cells or Vt repaired cells to be less than the source voltage.

For the embodiments described, the particular over-erased cell selected for Vt repair receives +5V at the drain (bitline) and +5V at the gate (wordline), respectively. Non-selected bitlines, and therefore the drain voltages of cells in the non-selected bitlines, are grounded.

Figure 7:
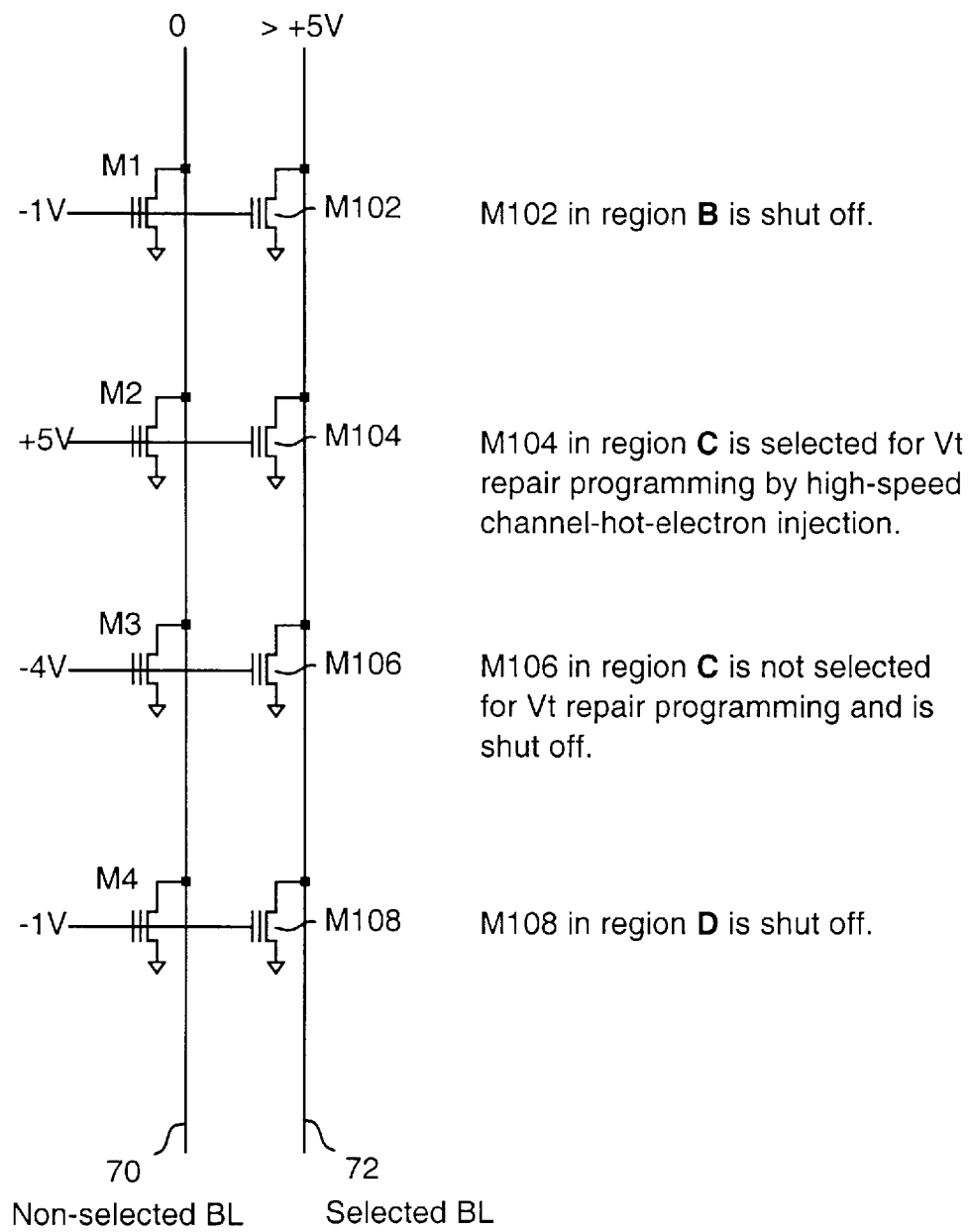
FIGS. 7 through 9 are circuit diagrams corresponding to the graph of FIG. 5 illustrating the method according to the present invention.
Figure 8:
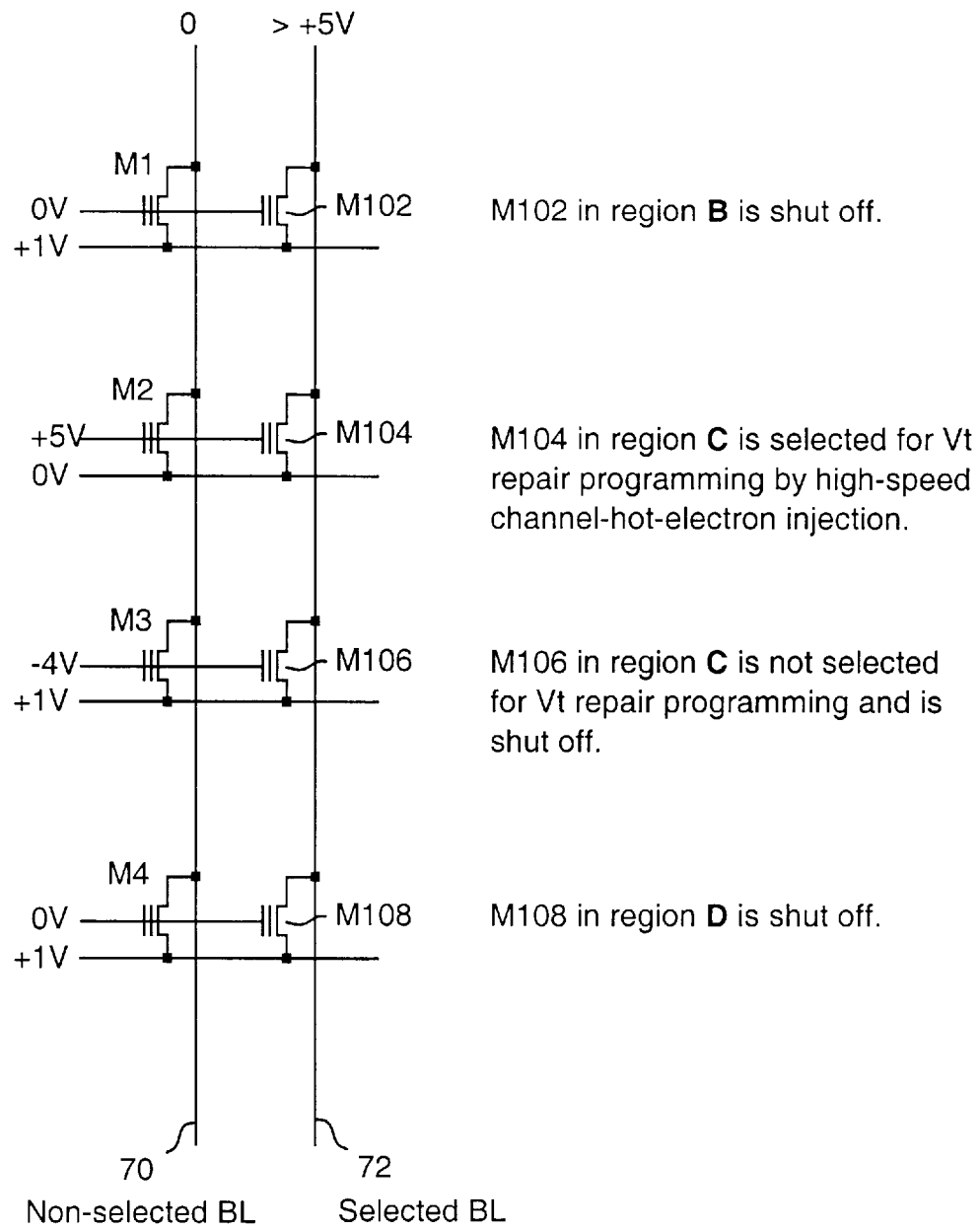
Figure 9:
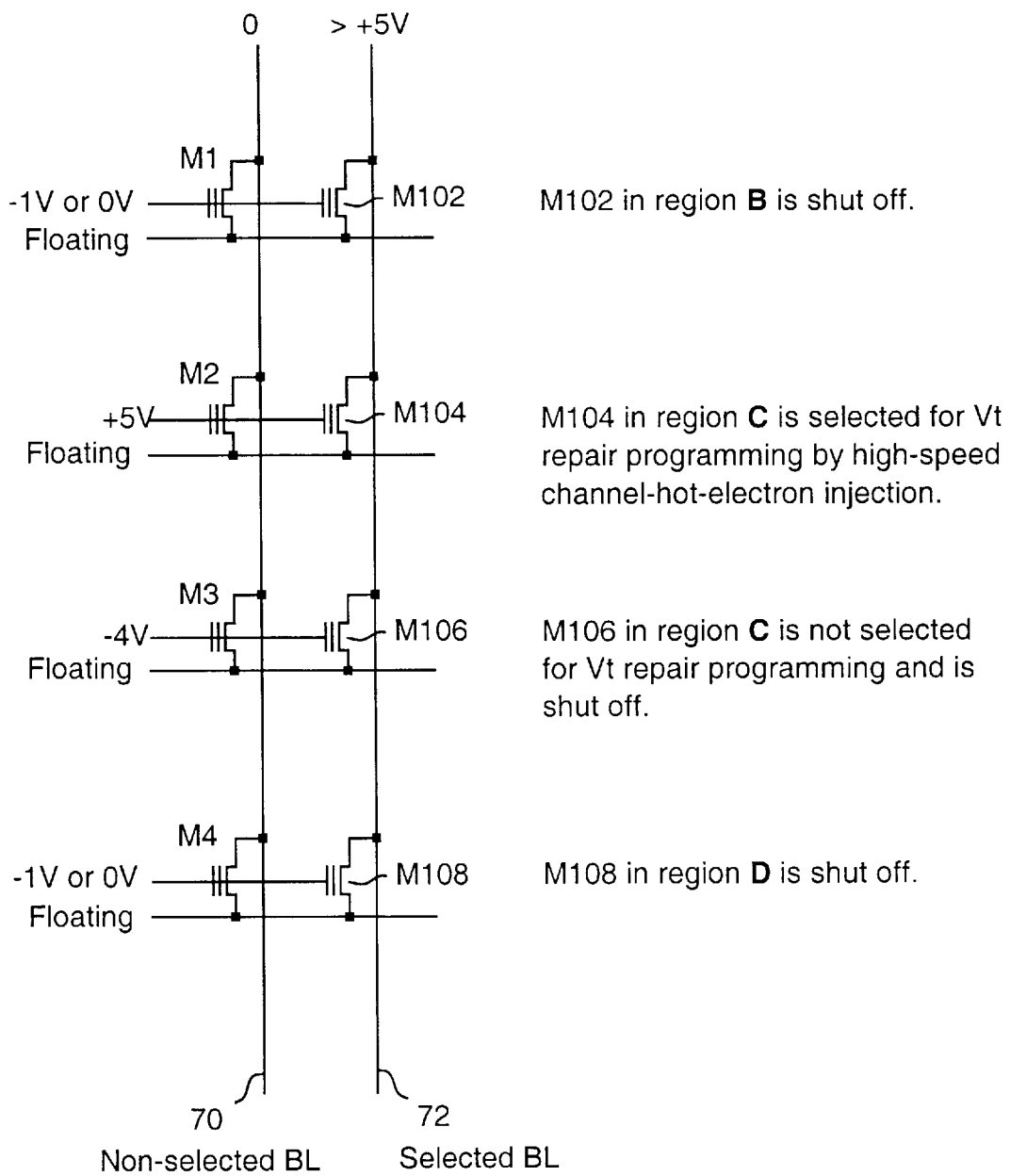

FIGS. 7, 8 and 9 illustrate three different embodiments for biasing the other cells during a Vt repair operation of the overerased cell using various wordline and sourceline voltage combinations. Each of these different embodiments cause the floating gate voltage for non-selected non-erased and previously Vt repaired cells to be less than the source voltage, thereby completely shutting off the channel in each of these cells and preventing subthreshold current leakage. For all three embodiments, the specific voltages provided are exemplary and can be modified, as long as the chosen voltages prevent subthreshold current leakage by biasing the floating gate voltage of non-erased cells or Vt repaired cells to be less than the source voltage.

Turning to FIG. 7, all of the cells types in this embodiment have grounded sources, regardless of their Vt level. Similar to the applicant's earlier application, noted above with reference to FIGS. 3 and 4, the present invention also will result in no cells having a region A Vt characteristic because the invention prevents incorrect erasure and verification caused by bitline leakage current.

For clarity, the figures show both a non-selected bitline 70 and a bitline selected for repair 72. The non-selected bitline 70 is grounded, while the selected bitline 72 receives a positive voltage, such as +5V or more.

Cells 102 and 108 are cells in the selected bitline 72 and have Vt's falling in regions D and B, respectively, after an erasure operation. Thus, cells 102 and 108 are respectively in the data "1" state and the data "0" state. During a subsequent Vt repair operation, region B and D cells, such as illustrated by cells 102 and 108, each receive a -1V wordline voltage. This 31 1V wordline voltage, in combination with the 0V source voltage, biases the floating gate voltages of cells 102 and 108 to be less than the source voltage. This biasing completely shuts the cell off, preventing subthreshold current leakage and thereby preventing fluctuation of their threshold voltages during Vt repair of another cell in the bitline. As noted above, however, this biasing is performed to ensure that the region B cells will not suffer from subthreshold current leakage, since even a ground wordline voltage applied to region A cells would prevent subthreshold current leakage in them.

The small negative gate voltage, such as -1V, needs to be applied to cells in region B during the repair operation to prevent oxide and Vt degradation in the cells while another cell in the bitline is being repaired. Although a 0V wordline voltage would partially shut off these cells, it will not be sufficient to prevent oxide and Vt degradation of cells in regions B, such as cells 102, and region C cells, such as cell 104, disposed in the same bitline is being repaired. For example, during the repair operation, the 5V drain voltage couples to the floating gate of the cell to be repaired. If the Vt of cells in region B is initially around +0.5V or +1V before the repair operation and if a 0V wordline voltage is used to shut off the non-selected cells, these cells will start conducting subthreshold current and generating hot electrons and, more importantly, undesirable hot holes, which will lower the region B cell's Vt and degrade the cell. Also, if the Vt of the region B cells was near or below ground before the subthreshold current was generated, the region B cell's Vt will possibly drop below ground once the repair operation is completed, causing false readings in a subsequent read operation. In other words, using a 0V gate voltage to shut off a region B cell will cause the cell's Vt to degrade while other cells are being repaired, and this Vt degradation thus will cause the cell to change its Vt characteristics such that it becomes a region C cell needing overerase Vt repair once the repair of other cells is completed.

As described by the above embodiment, Vt degradation of cells in region B can be avoided if a small negative wordline voltage, preferably around -1V, is applied to the gate instead of a 0V wordline voltage. Like the cells falling in region D in the same bitline selected for Vt repair, region B cells have a grounded source voltage. The small negative wordline voltage, in combination with the grounded source, completely and securely shuts off region B cells without any danger that its initial Vt will be affected while another cell in the same bitline is being repaired. As explained above, this particular -1V wordline voltage and 0V source voltage combination for cell 102 biases the floating gate voltage to be less than the source voltage. Larger negative wordline voltages of -2V or more could be applied to shut off these region B cells but is preferably avoided to reduce stress on the cell. Also, the negative voltage applied could be less than -1V, such as -0.5V, depending upon other circuit conditions.

With respect to erased region C cells, such as a cell 104 in FIG. 7 that is selected for repair, the cell 104 receives a wordline voltage greater than +5V, for example, for faster Vt repair. The floating gate is coupled to the +5V drain voltage and the source voltage is grounded. Note that cells in multiple bitlines can be repaired at the same time, and the number of bitlines being repaired is limited only by the supply current capacity of the current pump. Further, if a given erased bitline does not have any over-erased cells, the Vt repair operation can be skipped for that bitline, further saving power and time.

For region C cells, such as cell 106, that are not selected for Vt repair during a particular Vt repair cycle, a −1V gate voltage is not enough to shut off the cell because the threshold voltage of the cell ($CVt_{min}$) is lower than −1V, and will thereby cause bitline leakage. Thus, a voltage of $Vt_{min}$−1V is used to shut off each Region C cell, such as cell 106, and prevent bitline leakage. For example, if $Vt_{min}$ of the region C cell is the cell 106 having a Vt of −3V, then a −4V wordline voltage should be applied to the gate of cell 106 and preclude leakage current and still avoid breakdown in cell 106 during Vt repair of the overerased cell being repair, cell 104 in the example being provided. Similarly, if the $Vt_{min}$ of the region C cell is only a small negative voltage, only −1V may be needed to shut the cell off. Although in this example −4V wordline voltage could theoretically be applied to all non-selected cells in the bitline, this should be avoided to minimize stress on the cells; the invention aims to tailor the gate voltage applied to each cell to the individual cell's Vt characteristics rather than apply the same gate voltage to all cells. Like the cells in regions B and D, the source is grounded for region C cells.

FIGS. 8 and 9 show other embodiments applying this concept. For example, instead of having a wordline voltage around −1V and a grounded source to keep the floating gate equivalently less than ground, FIG. 8 shows applying a sourceline voltage of +1V and a wordline voltage of 0V to non-selected cells in regions B and D (cells 102 and 108, respectively) in the selected bitline 72 to make the floating gate voltage less than the source voltage. Non-selected cells in region C which have a negative Vt, such as cell 106, will receive a wordline voltage that is lower than the Vt voltage to shut each of them off, such as −4V wordline voltage if it assumed that it has the Vtmin of −3V. The sourceline for the cell 104 being repaired, unlike for the other cells, is grounded. Like in the embodiment shown in FIG. 7, this embodiment shuts off cells in regions B, C and D, such as cells 102, 106 and 108, to prevent them from conducting subthreshold current as another overerased region C cell 104 is being repaired.

FIG. 9 shows yet another alternative for shutting off cells non-selected for overerase Vt repair. Instead of selecting a specific source voltage for the non-selected cells 102, 106 and 108, the sourcelines associated with these cells are kept floating; that is, the source nodes for these cells are in a high impedance state. The sourceline for cell 104, like in FIG. 8, is grounded. Since in this embodiment the sourcelines for non-selected cells 102, 106 and 108 have no path to ground, no current leakage can occur while the cell 104 is being Vt repaired. Cells such as cells 102 and 108 of regions B and D, which have a positive Vt, and particularly the region B cells such as cells 102, receive wordline voltages of −1V or 0V to bias the floating gate voltage below ground with respect to the source voltage, as explained above, and are thereby shut off. Non-selected cells in region C which have a negative Vt, such as cell 106, will receive a wordline voltage that is lower than the Vt voltage to shut each of them off, such as −4V wordline voltage if it assumed that it has the Vtmin of −3V.

In the invention, the wordline voltage applied to the respective cells are not fixed values for any particular cell during different repair cycles. Instead, the wordline voltages applied to the cells are changed between each Vt repair operation to conform to each cell's then current Vt characteristics. A cell falling into region C after erasure, as explained above, initially has a negative Vt and receives a positive gate voltage, such as +5V, to program the negative Vt to a positive value. Once the cell's negative Vt is repaired to a positive Vt value, the cell's Vt characteristic changes from region C (an overerased cell selected for repair) to region B (a cell having a positive Vt). The wordline voltage subsequently applied to that cell is changed accordingly, and a wordline voltage of −1V will then be used to bias the floating gate voltage below the source voltage and preserve the repaired cell's Vt characteristics. When determining the new wordline and sourceline voltages to use in each subsequent repair cycle, each cells' new Vt characteristics are determined to reduce circuit stress on the cells even further and allow longer endurance cycles.

Figure 10:
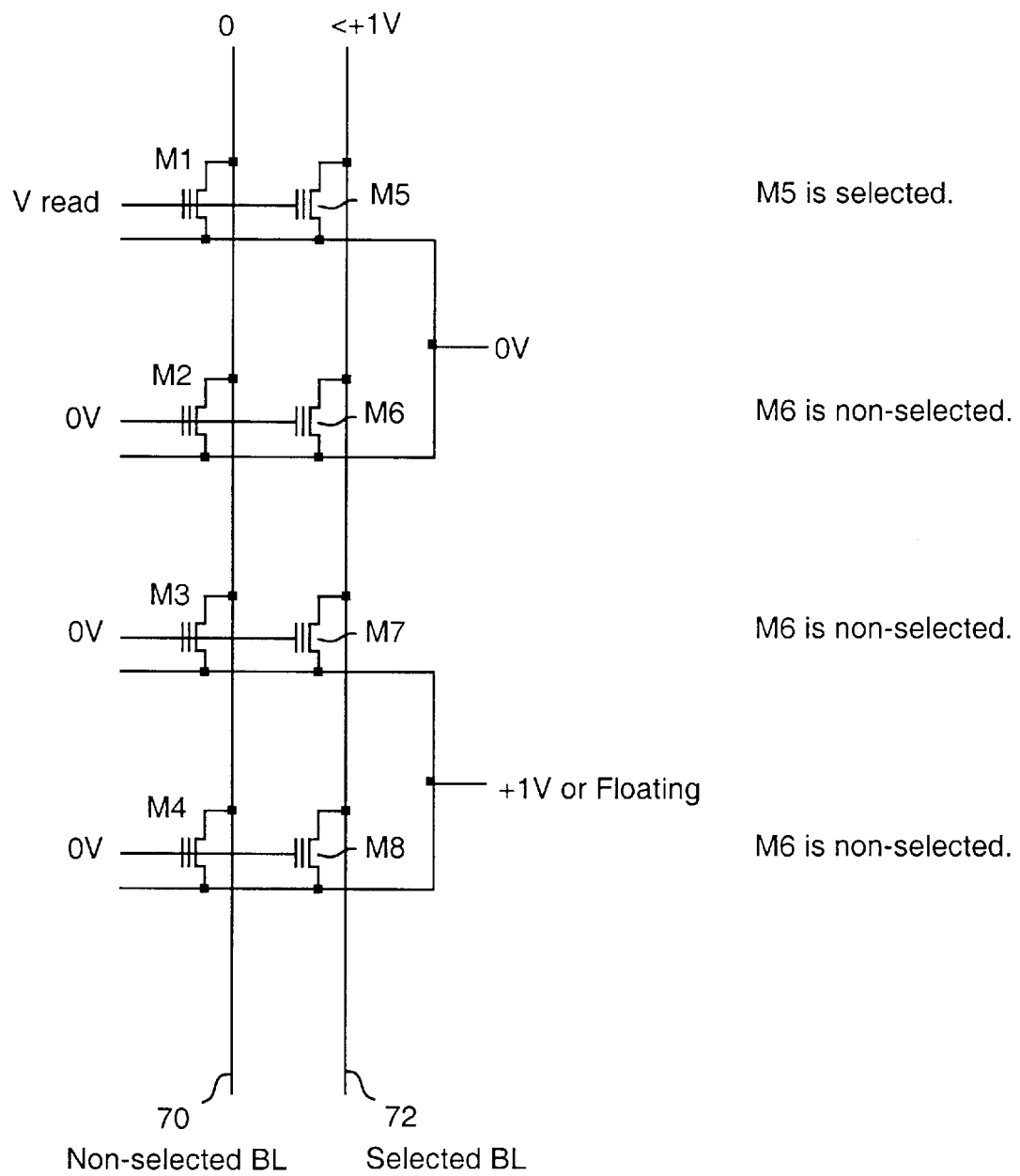
FIGS. 10–11 are circuit diagrams corresponding to the read and verify operations used according to the present invention.
Figure 11:
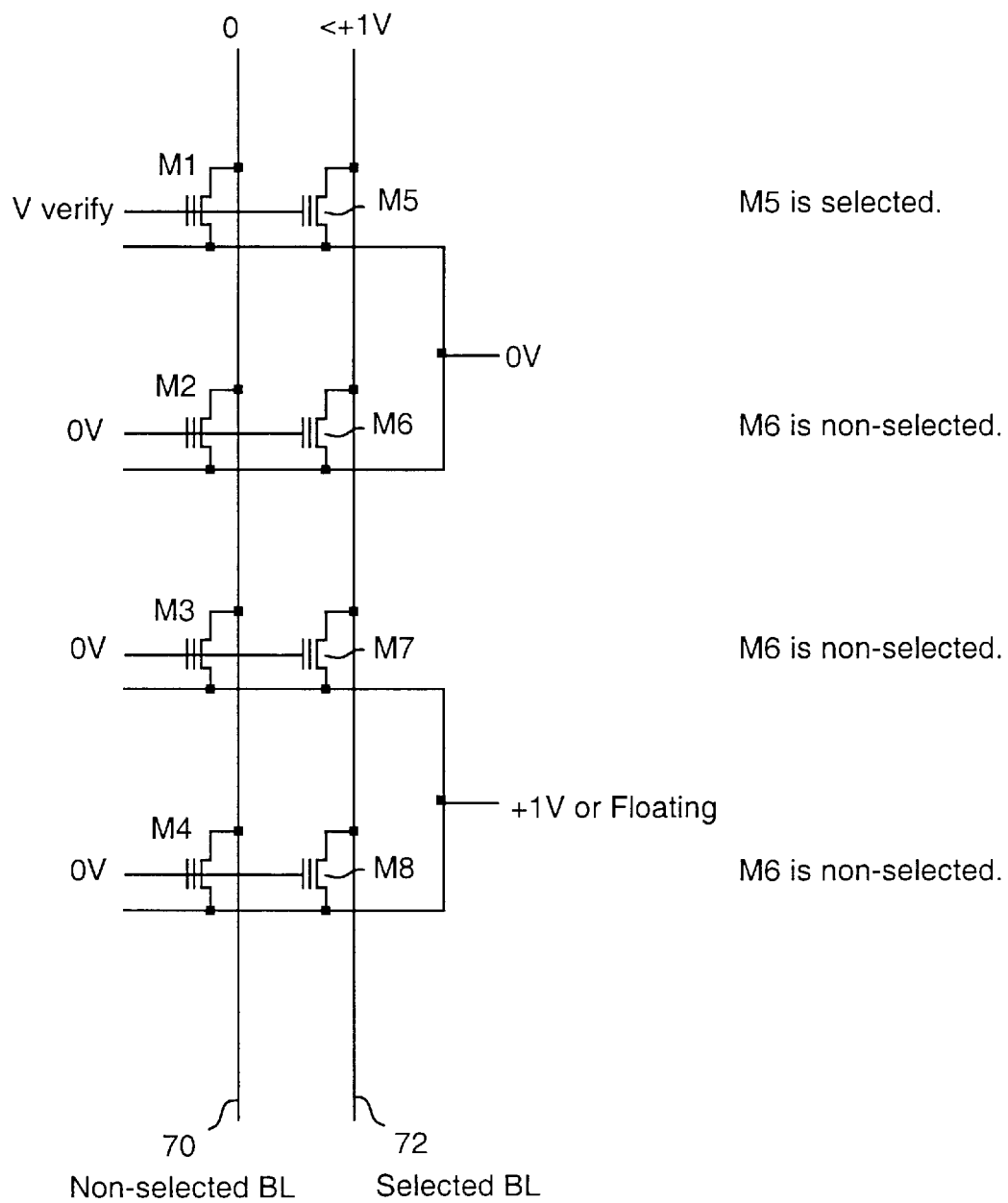

FIGS. 10 and 11 illustrate cells within a portion of a selected bitline 72 and a non-selected bitline 20 and the wordline and sourceline voltages applied thereto in read and verify operations, respectively. In a manner similar to that described previously with respect to subthreshold leakage in non-selected cells having a positive Vt that can occur during an overerase repair operation, subthreshold leakage can also occur during a read or verify operation. Such leakage is of particular concern when a lower Vdd, such as 1.8V, is used, in conjunction with Vt ranges of between 0.5V and 1V for a data "1" and a Vt greater than 3V for a data "0".

Accordingly, during a read or verify operation, the selected cell, such as cell M5 in FIGS. 10 and 11, has applied to it a wordline voltage that corresponds to the read and verify voltages. The wordlines of all of the other non-selected cells, such as cells M6, M7 and M8 in FIGS. 10 and 11 have a 0V ground wordline voltage applied to each of their gates. Furthermore, the sourceline voltage applied to the non-selected cells is preferably either a positive voltage that is less than the bitline voltage or a high impedance state caused by leaving these lines floating. In a particularly preferred embodiment, the bitline voltage is about 1V, and the sourceline has a level that is between 0.5V and the bitline voltage, with the gate of the non-selected cell being grounded.

It is noted, however, that if the sourcelines are connected as illustrated in the FIG. 6, that the nonselected cell, such as cell M6 in FIGS. 10 and 11, will be connected to the same sourceline as the selected cell, such as cell M5 in FIGS. 10 and 11. Accordingly, even though a few cells, such as cell M6 per each bitline, may have subthreshold leakage, the rest of the cells in the selected bitline will not, which will improve overall operation during read and verify operations.

To summarize, the invention provides a method for Vt repairing a flash memory employing at least three different wordline voltages to provide the most efficient Vt repair by taking each cell's individual Vt characteristics into account. Thus, cells that have not been erased, cells that have been properly erased, cells that have been properly repaired after having been overerased, and cells that have been overerased, each have applied to their gate a wordline voltage that is appropriate for their then current characteristics. Regardless of the specific source and wordline voltages chosen, the floating gate voltage of each non-erased cells, overerased but non-selected cells or previously repaired cells is selected to be lower than the source voltage to shut off each cell to prevent current leakage and Vt degradation. Because each bitline will have only one cell obtaining Vt repair at time, precise and fast Vt control can be achieved.

The invention also provides a method for ensuring that subthreshold leakage does not occur during a read or verify operation, by biasing the gates and sources of unselected cells in a bitlines appropriately.

While the present invention has been described with reference to preferred embodiments, variations and modifications may be made without departing from the spirit and scope of the invention as defined in the claims.

What is claimed is:

1. A method for repairing threshold voltages of a plurality of overerased cells in a plurality of bitlines in a flash memory, the method comprising:

selecting an erased bitline for repairing the threshold voltages of overerased cells in said erased bitline;

categorizing each of said plurality of cells in the selected erased bitline into first, second, and third regions based on a threshold voltage of each cell, wherein first region cells have a positive threshold voltage and were erased in the selected erased bitline, a second region cell has a negative threshold voltage, and third region cells have a positive threshold voltage higher than that of the first region cells and which were not selected for erasure in the selected erased bitline;

applying a first wordline voltage and a first source voltage to the first region cells to maintain the positive threshold voltages of the first region cells as the second region cell is being repaired, wherein the first source voltage and the first wordline voltage bias a first floating gate voltage to be less than the first source voltage to prevent the first region cells from conducting current as the second region cell is being repaired;

applying a second wordline voltage and a second source voltage to the second region cell, the second wordline voltage being a positive voltage to repair the second region cell by raising the threshold voltage of the second region cell to a positive value; and applying a third wordline voltage and a third source voltage to each of the third region cells to maintain the positive threshold voltages of the third region cells as the second region cell is being repaired, wherein the third source voltage and the third wordline voltage bias a third floating gate voltage to be less than the third source voltage to prevent the third region cells from conducting current as the second region cell is being repaired.

2. The method according to claim 1, wherein the first wordline voltage is negative and the first source voltage is equal to ground to bias the first floating gate voltage to be less than the first source voltage.

3. The method according to claim 1, wherein the first wordline voltage is grounded and the first source voltage is positive to bias the first floating gate voltage to be less than the first source voltage.

4. The method according to claim 1, wherein the first wordline voltage is greater than or equal to ground and the first source voltage is floating to bias the first floating gate voltage to be less than the first source voltage.

5. The method according to claim 1, wherein the selected bitline contains a plurality of negative threshold voltage cells such that only one of said plurality of negative threshold voltage cells in the selected erased bitline is selected as the second region cell during a threshold voltage repair cycle.

6. The method according to claim 5, wherein the plurality of negative threshold voltage cells not selected as the second region cell receive fourth wordline voltages having different values, depending on the different negative threshold voltages of each of the plurality of negative threshold voltage cells, to maintain the negative threshold voltage of each cell.

7. The method according to claim 1, wherein the third wordline voltage is negative and the third source voltage is equal to ground to bias the third floating gate voltage to be less than the third source voltage.

8. The method according to claim 1, wherein the third wordline voltage is grounded and the third source voltage is positive to bias the third floating gate voltage to be less than the third source voltage.

9. The method according to claim 1, wherein the third wordline voltage is greater than or equal to ground and the third source voltage is floating to bias the third floating wordline voltage to be less than the third source voltage.

10. The method of claim 1, wherein the categorizing and applying steps are repeated on the same cells in the selected bitline so that the first, second, and third wordline voltages are applied such that all of the cells selected to be programmed become first region cells.

11. The method according to claim 1, wherein the first and third source voltages have the same value.

12. The method according to claim 1, wherein the first, second, and third source voltages all have the same value.

13. The method according to claim 1, wherein the first and third wordline voltages have the same value.

14. A method for repairing threshold voltages of a plurality of overerased cells in a plurality of bitlines in a flash memory, the method comprising:

determining whether each bitline is an erased bitline, which contains cells having negative threshold voltages, or an unerased bitline, which does not contain cells having negative threshold voltages;

selecting erased bitlines for controlling the threshold voltage distribution of the plurality of cells in the selected erased bitlines during an overerase repair operation;

categorizing each of said plurality of cells in each selected erased bitline into first, second, and third regions based on a threshold voltage of each cell, wherein first region cells have a positive threshold voltage and were erased in the selected erased bitline, a second region cell has a negative threshold voltage, and third region cells have a positive threshold voltage higher than that of the first region cells and which were not selected for erasure in the selected erased bitline;

applying a first wordline voltage and a first source voltage to the first region cells to maintain the positive threshold voltages of the first region cells as the second region cell is being repaired, wherein the first source voltage and the first wordline voltage bias a first floating gate voltage to be less than the first source voltage to prevent the first region cells from conducting current as the second region cell is being repaired;

applying a second wordline voltage and a second source voltage to the second region cell, the second wordline voltage being a positive voltage to repair the second region cell by raising the threshold voltage of the second region cell to a positive value;

applying a third wordline voltage and a third source voltage to each of the third region cells to maintain the positive threshold voltages of the third region cells as the second region cell is being repaired, wherein the third source voltage and the third wordline voltage bias a third floating gate voltage to be less than the third source voltage to prevent the third region cells from conducting current as the second region cell is being repaired; and repeating the categorizing and applying steps on the same cells in each selected bitline until all of the cells selected to be repaired become first region cells.

15. The method according to claim 14, wherein the first wordline voltage is negative and the first source voltage is equal to ground to bias the first floating gate voltage to be less than the first source voltage.

16. The method according to claim 14, wherein the first wordline voltage is grounded and the first source voltage is positive to bias the first floating gate voltage to be less than the first source voltage.

17. The method according to claim 14, wherein the first wordline voltage is greater than or equal to ground and the first source voltage is floating to bias the first floating gate voltage to be less than the first source voltage.

18. The method according to claim 14, wherein the selected bitline contains a plurality of negative threshold voltage cells such that only one of said plurality of negative threshold voltage cells in the selected erased bitline is categorized as the second region cell during a threshold voltage repair cycle.

19. The method according to claim 18, wherein the plurality of negative threshold voltage cells not selected as the second region cell receive fourth wordline voltages having different values depending on the different negative threshold voltages of the plurality of negative threshold voltage cells.

20. The method according to claim 14, wherein the third wordline voltage is negative and the third source voltage is equal to ground to bias the third floating gate voltage to be less than the third source voltage.

21. The method according to claim 14, wherein the third wordline voltage is grounded and the third source voltage is positive to bias the third floating gate voltage to be less than the third source voltage.

22. The method according to claim 14, wherein the third wordline voltage is greater than or equal to ground and the third source voltage is floating to bias the third floating gate voltage to be less than the third source voltage.

23. The method according to claim 14, wherein the first and third source voltages have the same value.

24. The method according to claim 14, wherein the first, second, and third source voltages all have the same value.

25. The method according to claim 14, wherein the first and third wordline voltages have the same value.

26. A method of eliminating sub-threshold leakage in cells of a flash memory device during one of a read operation and a verify operation comprising the steps of:

selecting a bitline containing a plurality of cells, the plurality of cells including one selected cell and a plurality of non-selected cells;

selecting a wordline corresponding to the selected cell;

applying a wordline voltage to gates of each of the plurality of non-selected cells;

applying a sourceline voltage to each sources of the plurality of non-selected cells so that the wordline voltage and the sourceline voltage bias a floating gate voltage within each of the non-selected cells to be less than the sourceline voltage to prevent the non-selected cells from conducting current as the selected cell is being operated upon; and performing said one operation on said selected cell while said ground wordline voltage and said positive sourceline voltage is being applied to each of said plurality of non-selected cells.

\* \* \* \* \*